United States Patent [19]

Sasaki

[11] Patent Number: 4,771,323
[45] Date of Patent: Sep. 13, 1988

[54] SEMICONDUCTOR MEMORY DEVICE

[75] Inventor: Masayoshi Sasaki, Tokyo, Japan

[73] Assignee: Oki Electric Industry Co., Ltd., Tokyo, Japan

[21] Appl. No.: 52,592

[22] Filed: May 21, 1987

[30] Foreign Application Priority Data

Jul. 14, 1986 [JP] Japan ................................ 61-163849

[51] Int. Cl.⁴ ..................... H01L 29/78; H01L 29/04; H01L 27/02
[52] U.S. Cl. .................................... 357/23.6; 357/59; 357/42; 357/23.7; 365/182; 365/186
[58] Field of Search .................. 357/23.6, 59 G, 59 E; 365/182, 186; 357/42, 23.7

[56] References Cited

U.S. PATENT DOCUMENTS 4,536,785  8/1985  Gibbons ............................ 357/23.1
4,633,438 12/1986  Kume et al. ......................... 365/182
4,669,062  5/1987  Nakano .............................. 357/23.7

FOREIGN PATENT DOCUMENTS 60-246671 12/1985  Japan ................................ 357/23.6

OTHER PUBLICATIONS

Extended Abstracts of the 16th (1984) International Conference on Solid State Devices and Materials, Kobe 1984, pp. 265, "TITE RAM; A NEW SOI DRAM Gain Cell for M bit DRAM's" Shichijo, et al.

Primary Examiner—Andrew J. James
Assistant Examiner—Jerome Jackson, Jr.
Attorney, Agent, or Firm—Spencer & Frank

[57] ABSTRACT

In a semiconductor memory device, a memory cell comprises a first MOS transistor (Q1) of a first channel type formed on a semiconductor substrate and having a gate electrode connected to a word line. A charge storage electrode is connected to the drain of the first transistor and forms a capacitor with the gate electrode. A semiconductor layer is formed over the charge storage electrode. A second MOS transistor (Q2) of a second channel type formed in the semiconductor layer. The charge storage electrode forms a gate electrode of the second transistor. The drain of the second transistor is connected to a power supply. The source of the second transistor is connected to a bit line, which is either the same as or separate from the first-mentioned bit line. For writing data, a first potential is applied to the word line to make conductive the first transistor for writing data, and the potential applied to the source of the first transistor is varied depending on whether the data to be written is "0" or "1". For maintaining the stored data, a second potential is applied to the word line to keep the first transistor nonconductive. For reading the stored data out, a third potential is applied to the word line to make the second transistor conductive or nonconductive depending on the data stored on the charge storage electrode.

20 Claims, 10 Drawing Sheets

FIG. 8a
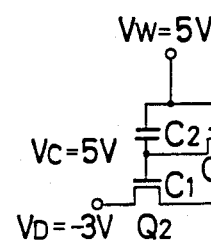
FIG. 8b
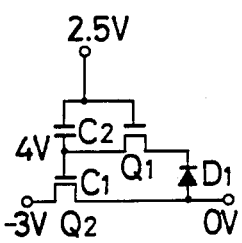
FIG. 8c
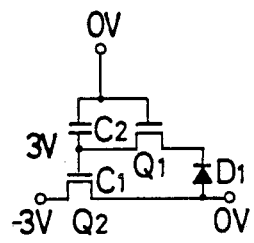
FIG. 8d
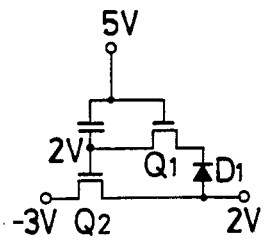
FIG. 8e
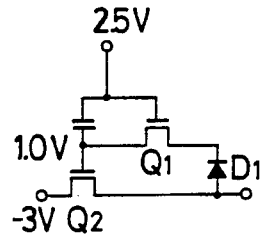
FIG. 8f
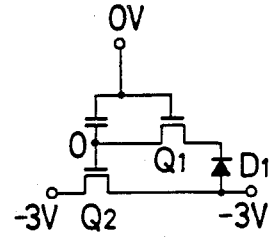
FIG. 9
|  |  | Vw | Vb |
|---|---|---|---|
| WRITING | 1 | 5 (V) | 5 (V) |
|  | 0 | 5 | 2 |
| MAINTAINING |  | 2.5 | — |
| READING | 1 | 0 | 0 |
|  | 0 | 0 | −3 |

4,771,323

SEMICONDUCTOR MEMORY DEVICE

BACKGROUND OF THE INVENTION

The present invention relates to a semiconductor memory device, particularly to an improvement in a memory cell structure of a dynamic random access memory (DRAM).

A memory cell of a prior art DRAM comprises one switching transistor and one capacitor, wherein electric charge is transferred into or out of the capacitor through the switching transistor for data storage or data readout. To implement such a structure with a semiconductor device, a planar structure in which a capacitor formed of a silicon substrate, an oxide film, and a polysilicon electrode and a MOS transistor are formed of the same wafer surface. But, with the above-described structure, a limit is approached to the degree of integration To increase the degree of integration further, a new structure, shown in FIG. 1, is now being studied and developed in which a capacitor C is formed of a cell plate 3 filling a trench 2 provided in a silicon substrate 1, thereby to reduce the area for the capacitor while maintaining the capacitance of the capacitor C. A polysilicon word line 4 serves also as a gate, and an Al bit line 5 has a contact with one of the main electrodes of the transistor.

Another concept of "gain cell" is also being studied. In this structure each memory cell has an amplification function to compensate for the reduction in the stored electric charge along with the reduction in the size of the elements. An example of this structure is shown in "Extended Abstracts of the 16th (1984) International Conference on Solid State Devices and Materials, Kobe, 1984, pp. 265–268", and is shown in FIGS. 2, 3 and 4. As shown it comprises a bulk sense transistor 11, a polysilicon transistor 12, a writing word line 13, a reading word line 14, a writing bit line 15, a reading bit line 16, and a power supply line 17.

In this gain cell, the electric charge is stored in the capacitors C1 and C2, and the reading of the stored date can be effected by ON/OFF control of the bulk sense transistor 11. There is no inherent limit to the electric charge which can be read out. But with this structure, the transistor 12 connected to one electrode of the charge storage capacitor is a polysilicon transistor having a large leak age current, so that the stored charge may be lost. Another disadvantage is that two word lines and two bit lines are needed.

SUMMARY OF THE INVENTION

An object of the invention is to enable further increase in the degree of integration.

Another object of the invention is to reduce the leak age current from the stored charge, thereby to reduce the possibility of stored data being lost.

A further object of the invention is to eliminate the need for two word lines and two bit lines.

According to the invention, there is provided a semiconductor memory device comprising a matrix of memory cells, each memory cell comprising:

a first MOS transistor (Q1) of a first channel type formed on a semiconductor substrate and having a gate electrode connected to a word line, a drain and a source, the source being connected to a bit line, a charge storage electrode connected to the drain of the first transistor and formed over the gate electrode of the first transistor, being separated from the gate electrode by an insulating film to form a capacitor, a semiconductor layer formed over the charge storage electrode, being separated from the charge storage electrode by an insulating film, a second MOS transistor (Q2) of a second channel type different from the first channel type, formed in the semiconductor laYer and having a source and a drain, the charge storage electrode forming a gate electrode of the second MOS transistor, the drain of the second transistor being connected to a power supply, the source of the second transistor being connected to a bit line, which is either the same as or separate from the first-mentioned bit line, said memory device further comprising means for controlling writing and reading of data in and out of the memory cell, said control means writing data by controlling the potential on the word line and the bit line connected to the first MOS transistor to supply an electric charge corresponding to the data on the bit line connected to the first MOS transistor, said control means reading data by controlling the potential on the word line to cause conduction or nonconduction of the second MOS transistor depending on the electric charge stored on the charge storage electrode, thereby providing an output on the bit line connected to the second MOS transistor, the output differing depending on the conduction or nonconduction of the second MOS transistor.

According to the invention, the first MOS transistor serving as a data writing transistor, a charge storage electrode, and the second MOS transistor serving as a data reading transistor are provided in combination with each other, so that an amplification function is achieved by use of a smaller area. Moreover, the conductivity types of the data writing transistor and the data reading transistor are opposite to each other, and the gate electrodes of the respective transistors are capacitively coupled with the charge storage electrode, so that writing data and reading data can be controlled by a common word line. Furthermore, an SOI polysilicon transistor can be used as the data reading transistor, and fabrication of the memorY device is facilitated.

BRIEF DESCRIPTION OF THE DRAWINGS

In the accompanying drawings:

FIGS. 8a to 8f show the operation of the device of FIG. 5;

FIG. 9 is a table showing voltage values at different operating states of the device of FIG. 5;

DETAILED DESCRIPTION OF THE PREFERRED EMBODIMENTS

Figure 1:
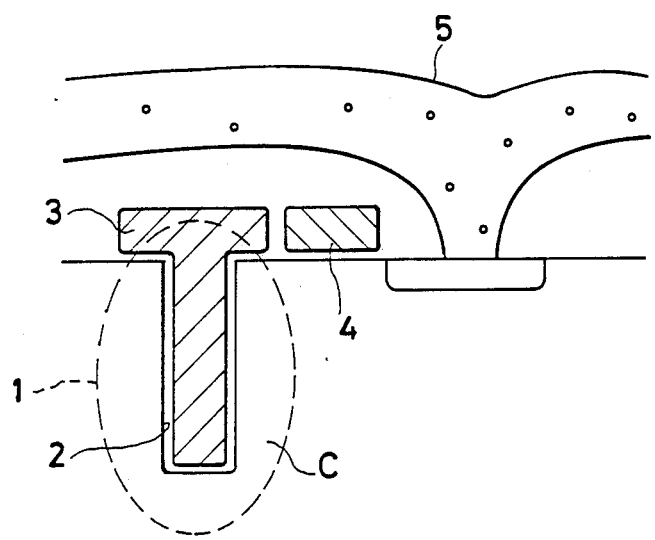
FIG. 1 is a cross sectional view showing a memory cell of a prior art DRAM.
Figure 2:
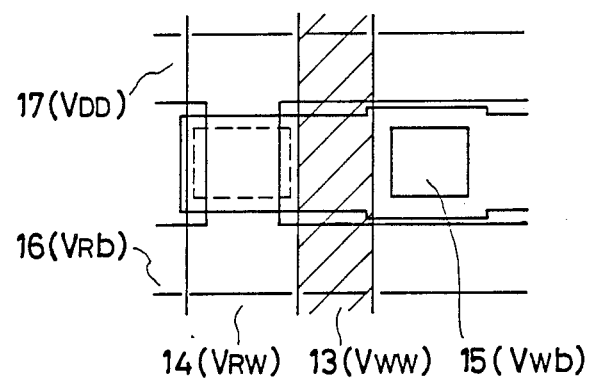
FIG. 2 is a plan view showing a prior art gain cell.
Figure 3:
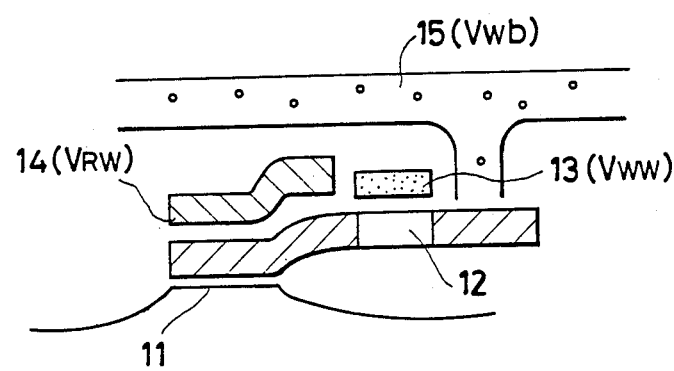
FIG. 3 is a cross sectional view showing the gain cell of FIG. 2.
Figure 4:
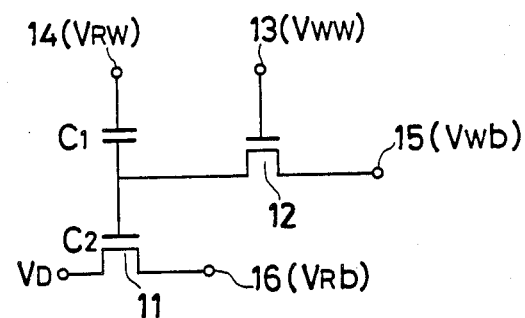
FIG. 4 is a circuit diagram showing an equivalent circuit of the gain cell of FIG. 2.
Figure 5:
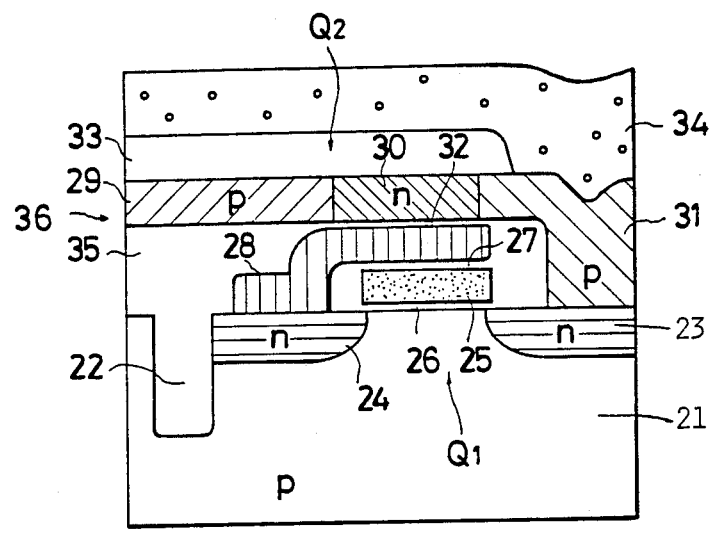
FIG. 5 is a cross sectional view showing a semiconductor device of an embodiment of the invention.
Figure 7:
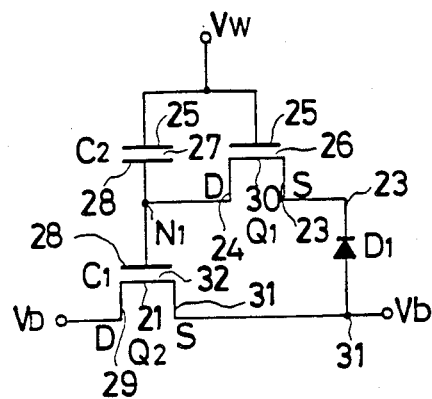
FIG. 7 is a circuit diagram showing an equivalent circuit showing the semiconductor device of FIG. 5.
Figure 6A:
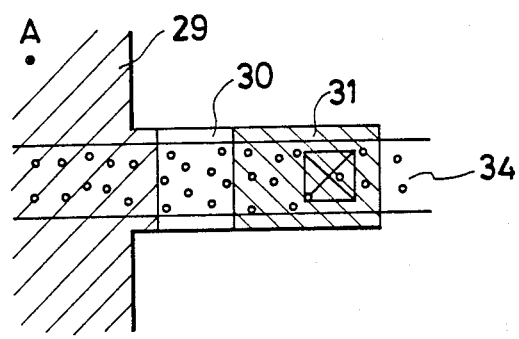
FIGS. 6a and 6b are plan views showing, at different levels or layers, the semiconductor device of FIG. 5.
Figure 6B:
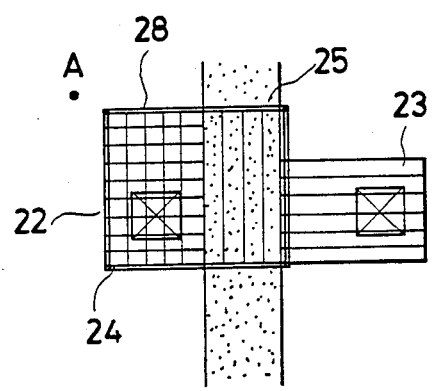

FIG. 5 shows a cross section of a gain cell of a semiconductor memory device of a first embodiment of the invention, and FIGS. 6a and 6b are plan views of the gain cell of FIG. 5, as seen at different layers. More particularly, FIG. 6a shows a polysilicon transistor and an Al bit line on the upper layer, while FIG. 6b shows layers below the electrodes of the charge storage capacitor. The points denoted by mark A in FIGS. 6a and 6b are in alignment with each other along the vertical direction so that they should be made to align when FIGS. 6a and 6b are placed adjacent each other: FIG. 7 is an equivalent circuit diagram of the gain cell shown in FIGS. 5, 6a and 6b.

The gain cell of the embodiment comprises a p-type silicon substrate 21, an element isolation silicon dioxide ($SiO_2$) film, a data writing transistor Q1 having a source (n-type region) 23, a drain (n-type region) 24 and a gate electrode 25. The writing transistor Q1 is shown to be an n-channel MOSFET. The drain 24 of the writing transistor Q1 is connected to a polysilicon electrode 28, which is opposite to the gate electrode 25 across a thin insulating film 27 to form a capacitor C1 (FIG. 7). A layer 36 of polysilicon is provided over the polysilicon electrode 28, being separated by a thin insulating film 32 forming a gate oxide film. The polysilicon layer 36 has regions 31 and 29 doped to be of a p-type and another region 30 doped to be of an n-type, and these regions 31, 29 and 30 serve as a source, a drain and a channel of p-channel data reading MOSFET Q2 and the polysilicon electrode 28 serves as a gate electrode of the MOSFET Q2. This MOSFET Q2 is formed on an insulator, i. e., it is an SOI (silicon on insulator) transistor. The source 31 of the transistor Q2 is in contact with the source 23 of the transistor Q1 to form a pn junction diode. The source 31 is also connected to an Al bit line 34. The Al bit line 34 and the polysilicon layer 36 are separated by an insulating layer 33 and the polysilicon layer 36 and the silicon substrate 21 are separated by an insulating layer 35.

As can be seen from the structure illustrated in FIG. 5 and the equivalent circuit illustrated in FIG. 7, the polysilicon electrode 28 in FIG. 5 corresponds to a node N1 in FIG. 7. The capacitance between the polysilicon electrode 28 and the channel 30 forms a capacitor C1, and the capacitance between the polysilicon electrode 28 and the gate electrode 25 forms a capacitor C2, and the polysilicon gate electrode 25 also serves as a word line.

The operation of the gain cell of FIGS. 5 to 7 will be described in detail with reference to FIGS. 8a to 8f.

FIGS. 8a, 8b and 8c respectively show the states of the cell at the time of writing, maintaining and reading data "1", and FIGS. 8d, 8e and 8f respectively show the states of the cell at the time of writing, maintaining and reading data "0".

It is assumed that the threshold voltage of the n-channel transistor Q1 is 3.5V (i.e., Q1 is ON at or above 3.5V), and the threshold voltage of the p-channel transistor Q2 is 0.5V (i.e., Q2 is ON at or below 0.5V), and the ratio C1/C2=3/2, and the power supply voltage $V_D$ is $-3V$.

For writing data, the word line voltage Vw is set at 5V and the bit line voltage Vb is set at 5V (for writing data "1") or 2V (for writing data "0"). The voltage Vc on the storage capacitor becomes 5V or 2V, (FIGS. 8a and 8d).

For maintaining data, the word line voltage Vw is reduced to 2.5V. The voltage Vc on the storage capacitor is reduced to 4V or 1.0V (FIGS. 8b and 8e).

For reading data, the word line voltage Vw is reduced to 0V. The reading transistor Q2 is kept off or turned on and the bit line voltage Vb is made at 0V when data "1" is stored or at $-3V$ when data "0" is stored (FIGS. 8c and 8f).

This will be explained in further detail.

When data "1" is to be written, the word line voltage Vw is set at 5V and the bit line voltage Vb is set at 5V. Then the writing transistor Q1 becomes conductive and the voltage Vc on the storage capacitor becomes 5V. This is shown in FIG. 8a.

If the word line voltage Vw is reduced to 2.5V, the writing transistor Q1, whose threshold voltage is 3.5V, is turned off and the data charge is stored and maintained in the storage capacitor. The voltage Vc is determined by the capacitances C1 and C2, and the word line voltage Vw, and, in the conditions of example given, Vc become 4V. This is shown in FIG. 8b.

For reading, the word line voltage Vw is lowered to 0V. The voltage Vc accordingly is lowered to 3V. With this voltage, the reading transistor Q2 is kept off and the bit line voltage Vb is kept at 0V, as shown in FIG. 8c. This corresponds to data "1".

When data "0" is to be written, the bit line voltage Vb is set at 2V (FIG. 8d). The word line voltage Vw is set at 5V, similarly as in FIG. 8a. The writing transistor Q1 is made conductive and the voltage Vc on the storage capacitor becomes 2V.

When the word line voltage Vw is reduced to 2.5V for maintaining the stored data, the voltage Vc is reduced to 1.0V (FIG. 8e).

When the word line voltage Vw is reduced to 0V for reading the stored data, the voltage Vc becomes 0V and the transistor Q2 is turned on, so that the bit line voltage Vb becomes $-3V$, which corresponds to the data "0" (FIG. 8f).

The values of Vw and Vb in various states are shown in the Table of FIG. 9.

In the above description, the voltage drop across the diode D1 is neglected for simplicity of description. But actually the bit line voltage Vb at the time of writing data should be made higher than the values in the above description by the value of the voltage drop across the diode D1.

Figure 10:
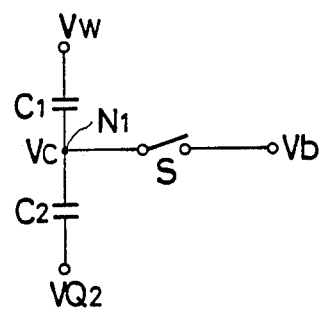
FIG. 10 is a circuit diagram simplified for analysis of the voltage on the data charge storage electrode.

Next, an analysis of the value of the voltage Vc on the storage capacitor is given below. For the sake of simplicity of description, the analysis is made on the equivalent circuit of FIG. 10.

If a switch S (corresponding to the transistor Q1) is closed and if Vw=Vw1, then Vc=Vb, so that the electric charge Q on the node N1 is given by:

$$Q = C1(Vb - Vw1) + C2(Vb - VQ2) \quad (1)$$

where VQ2 represents the substrate potential of the transistor Q2.

Assume that the switch S2 is subsequently opened and Vw is made Vw2. The electric charge Q on the node N1 is unchanged. So, $$Q = C1(Vc - Vw2) + C2(Vc - VQ2) \quad (2)$$

The voltage Vc on the node N1 is therefore given by:

$$Vc = [C1(Vb + Vw2 - Vw1) + C2Vb]/(C1 + C2) \quad (3)$$

Thus Vc is determined by the ratio between C1 and C2, and the values of Vb, Vw1 and Vw2.

Here, Vb and Vw1 are the bit line voltage and the word line voltage at the time of writing data and Vw2 is the word line voltage at the time of maintaining data or reading data.

If the threshold voltages of the transistors Q1 and Q2 are denoted by $V_{TQ1}$ and $V_{TQ2}$ respectively, it should be so designed that $$Vw2 < V_{TQ1} < Vw1 \quad (4)$$

$$V_{TQ2} > [C1(Vb0 + Vw2 - Vw1) + C2Vb0]/(C1+C2) \\ V_{TQ2} < [C1(Vb1 + Vw2 - Vw1) + C2Vb1]/(C1+C2) \quad (5)$$

Here, Vb0 and Vb1 are bit line voltages for writing data "0" and data "1" respectively.

It should be noted here that Vc should be not lower than the substrate potential. If Vc is negative with respect to the substrate potential, a diode formed between the drain (data charge storage region) 24 and the substrate becomes forward biased and the data charge is lost.

The diode D1 in FIG. 7 serves to prevent a current, which would otherwise flow at the time of the transistor Q2 being turned on and Vb being negative, thereby forward-biasing a diode formed of the n-type source 23 of the transistor Q1 and the p-type substrate 21.

Incidentally, when Vb is positive, a diode between the source 31 of the transistor Q2 and the substrate 21 of the transistor Q1 is forward-biased. But the substrate of the transistor Q2 is floating. The current must therefore flows through a pn junction between the drain 29 of the transistor Q2 and the substrate. The drain-substrate diode is however off. Accordingly, no current flows through the source 31 of the transistor Q2 and the substrate even when Vb is positive.

According to the invention, an SOI transistor is used as the data reading transistor. To form an SOI transistor, a technique for recrystallizing polysilicon by laser irradiation is being studied, and this method can be employed for realizing the SOI transistor according to the invention. Other methods can be equally employed. But it should be noted that the invention does not require the characteristic of the SOI transistor to be so good as was required in the prior art gain cell. This is because it is sufficient if there is a determinable distinction between on and off during the reading. Thus a polysilicon transistor can be used.

Figure 11:
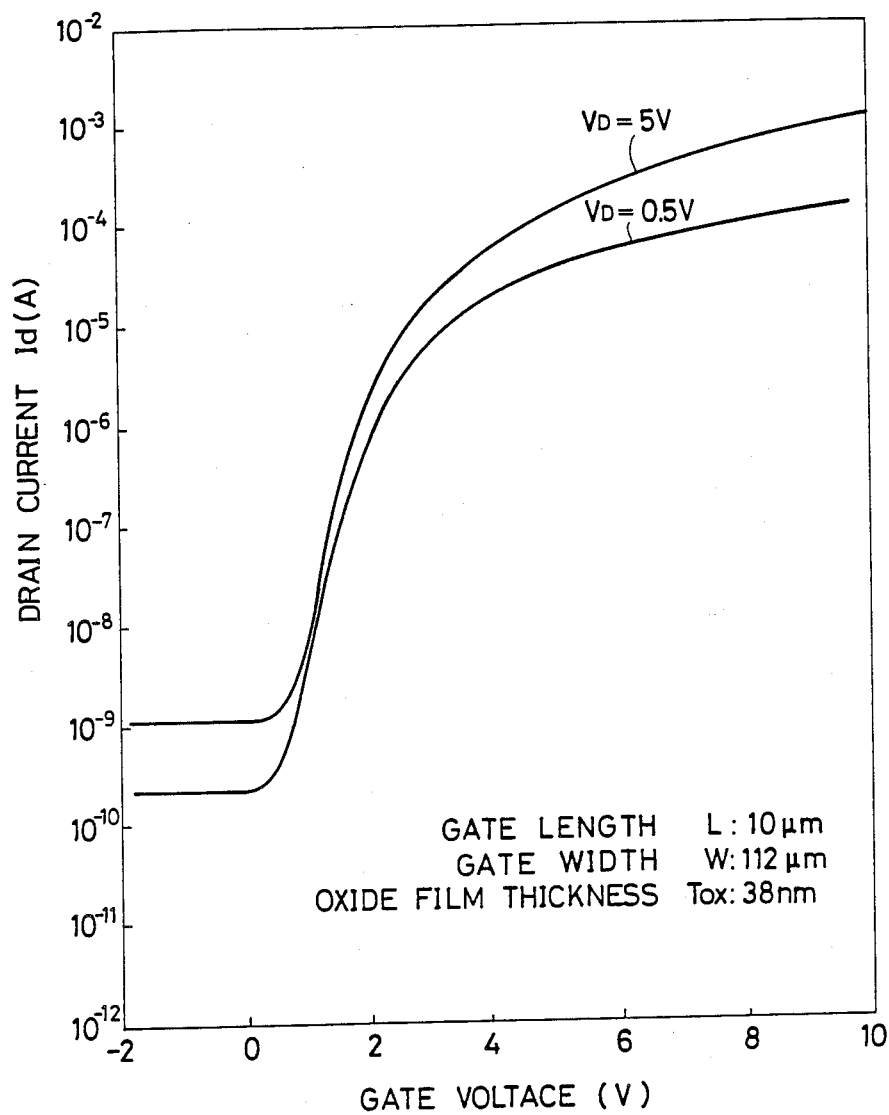
FIG. 11 shows a subthreshold characteristic of a polysilicon transistor according to the invention.

FIG. 11 shows a subthreshold (drain current versus gate voltage) characteristic of a polysilicon transistor used in the invention. It is assumed that the gate length L is 10 micrometers, the gate width W is 112 micrometers, the gate oxide film thickness Tox is 38 nm. The two curves are for the drain voltages Vd of 5V and 0.5V, respectively.

The on/off current ratio is about $10^4$ and the gradient of the curve in the subthreshold region is about 500 mV/dec or less. This characteristic is satisfactory for the cell of the invention.

In the embodiment described, the transistor Q1 is an n-channel MOSFET and the transistor Q2 is a p-channel MOSFET. But alternatively the transistors Q1 and Q2 can be of a p-channel and an n-channel, respectively, with the polarities of the voltages at various terminals or nodes being reversed. Similar operation and results can be obtained by such alteration.

In the embodiment described, the charge storage region is formed of polysilicon surrounded by an $SiO_2$ layer and the drain 24 of the transistor Q1 connected thereto. Reduction in the stored charge is dependent on the leak through the $SiO_2$ and the leak through the drain-substrate. But these can be easily controlled to be sufficiently small.

The structure of the embodiment is also advantageous in that soft errors due to alpha particles are reduced. Soft errors are caused when electric charges generated in the substrate due to alpha particles flow into the drain region. But according to the invention, the area of the drain region is small so that flow of the electric charges into the drain region can be made small, and hence soft errors are reduced.

Moreover, if a $p^-/p^+$ epitaxial structure is built in the substrate, the resistance to soft error is further improved.

In one particular form of the invention, the channels of the first transistor Q1 and of the second transistor Q2 extend in the direction of the bit lines and the word lines extend in a direction orthogonal to the direction of the bit lines.

Figure 12:
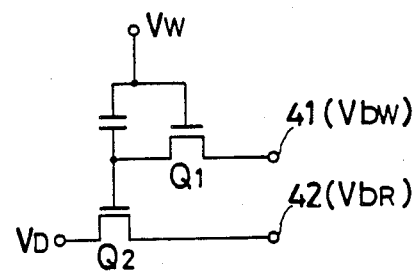
FIG. 12 is a circuit diagram showing an equivalent circuit of a second embodiment of the invention.

FIG. 12 is an equivalent circuit diagram showing a second embodiment of the invention.

Figure 13A:
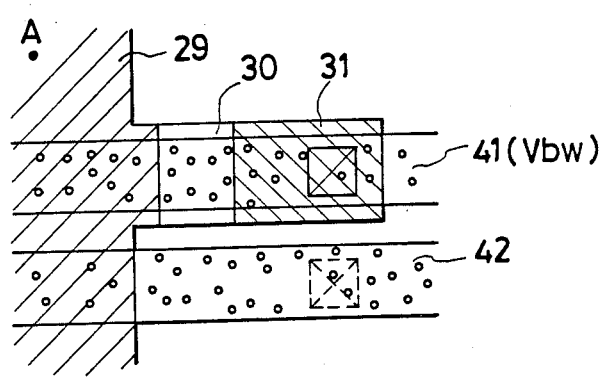
FIGS. 13a and 13b are plan views showing, at different levels or layers, the semiconductor device of FIG. 12.
Figure 13B:
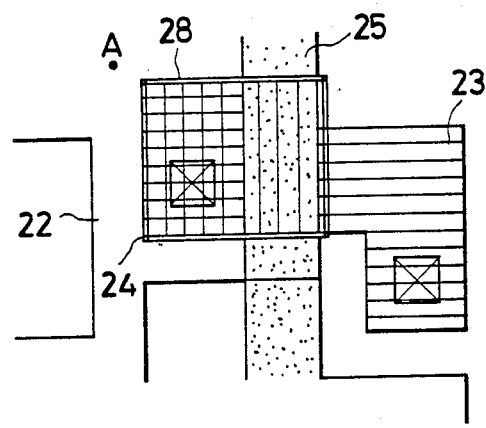

FIGS. 13a and 13b are paln views of the embodiment of FIG. 12 at different levels corresponding to FIGS. 6a and 6b. That is, FIG. 13a shows the upper polysilicon transistor and an A1 bit line, while FIG. 13b shows the electrode of the charge storage capacitor, and other layers below it. The points with a mark A in FIGS. 13a and 13b are in alignment with each other. In this embodiment, two separate bit lines are provided, one 41 (Vbw) for writing and the other 42 (Vbr) for reading. The rest of the structure is similar to that of the first embodiment of FIG. 5. Particularly, the members or parts denoted by the same reference as in FIGS. 5 to 7 have similar functions.

In the embodiment of FIGS. 12, 13a and 13b, two bit lines are required, but the diode D1 in the first embodiment is eliminated and the need to handle four different values of the voltages on the same bit line (as required in the first embodiment) is eliminated: According to this embodiment, there should appear two different values on the writing bit line and two different values on the reading bit lines, so that the peripheral circuits are easier to design.

Figure 14:
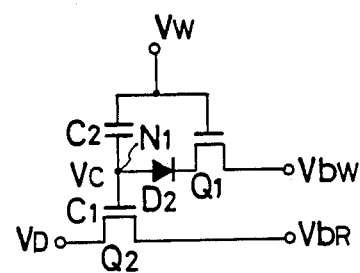
FIG. 14 is a diagram showing a third embodiment of the semiconductor memory device of the invention.

FIG. 14 is an equivalent circuit diagram of a third embodiment of the invention. In this embodiment, a diode D2 is inserted between the drain of the transistor Q1 and the charge storage electrode N1. If, during writing, Vw is made to be larger than Vbw to forward-bias this diode D2, electric charge is stored on the charge storage electrode. In the first and the second embodiments, when Vc becomes negative, the diode between the drain of the transistor Q1 and the substrate is forward-biased, and the stored charge is lost. The insertion of the diode D2 prevents such loss of the stored charge. Freedom of design in setting the word line voltage Vw and the writing voltage Vbw is thereby enlarged.

Figure 15:
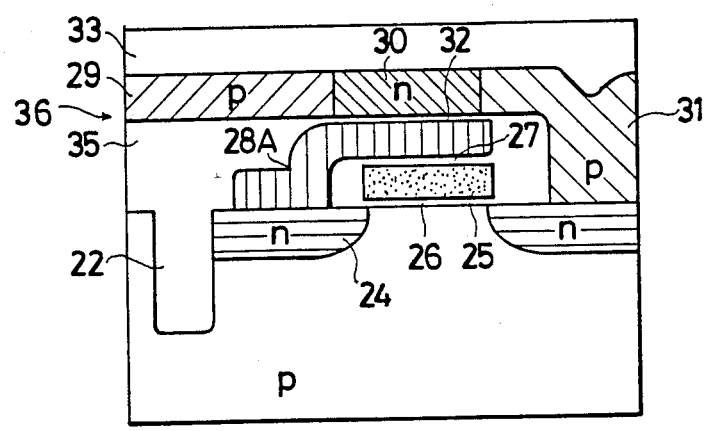
FIG. 15 is a cross sectional view showing the semiconductor memory device of FIG. 14.
Figure 16:
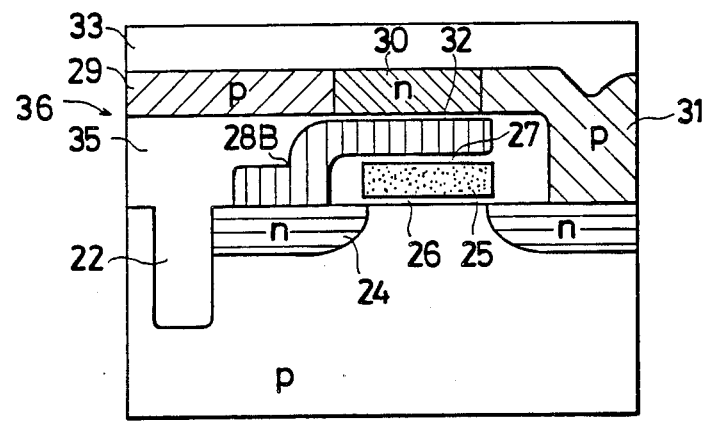
FIG. 16 is a cross sectional view showing a modification of the embodiment of FIGS. 14 and 15.

The diode D2 can be formed if, for example, the polysilicon layer 28 is doped to be of a p-type layer 28A (FIG. 15), so that a p-n junction is formed between the polysilicon layer 28A and the n-type drain region 24. As an alternative, a metal electrode 28B (FIG. 16) is formed instead of the polysilicon layer 28 (to constitute the charge storage electrode), so that a Schottky junction diode is formed between the metal electrode 28B and the drain 24.

Figure 17:
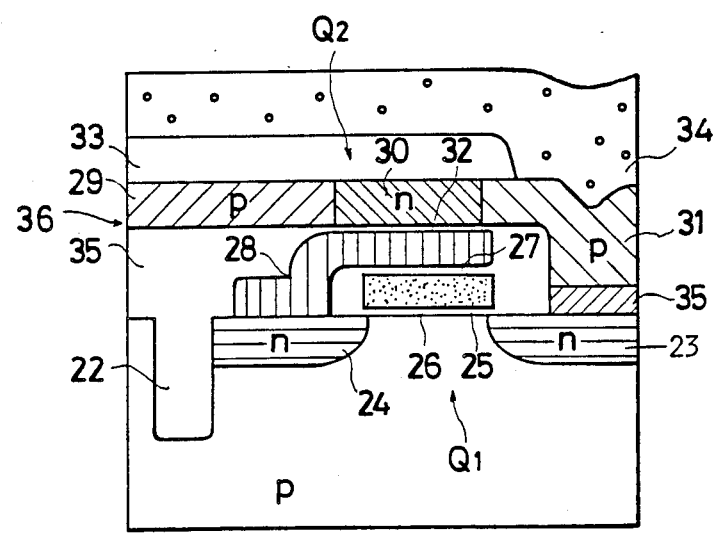
FIG. 17 is a cross sectional view showing a modification of the embodiment of FIG. 5.

The diode D1 can also be in the form of a Schottky junction diode. This can be implemented by inserting a metal layer 35 having an ohmic contact with the source 31 and forming a Schottky junction with the source 23, as shown in FIG. 17.

The invention is not limited to the embodiment described above, but various modifications can be made without departing from the scope and the spirit of the invention.

As has been described in detail, the invention has the following advantages: (a) A data writing transistor, a charge storage electrode, and a data reading transistor are provided in stack with each other, so that an amplification function is achieved by use of a smaller area. (b) The conductivity types of the data writing transistor and the data reading transistor are opposite to each other, and the gate electrodes of the respective transistors are capacitively coupled with the charge storage electrode, so that writing data and reading data can be controlled by a common word line. (c) An SOI polysilicon transistor can be used as a data reading transistor, and fabrication of the memory device is facilitated.

Use of the gain cell according to the invention facilitates data reading and a high-sensitivity sense amplifier circuit required in the prior art DRAM can be eliminated.

As was described earlier, the prior art memory cell structure in which the stored electric charge itself is detected will encounter a limit to reduction in size. According to the memory cell of the invention, the stored electric charge is maintained at the gate of a reading transistor, and the drain current of the reading transistor which itself is inherently unlimited is detected, so that no such problem of a limit to the size reduction is encountered. Accordingly, the structure of the invention can be applied to 16M bit or 64M bit DRAMs.

What is claimed is:

1. A semiconductor memory device comprising a matrix of memory cells, each memory cell comprising:
   a first MOS transistor (Q1) of a first channel type formed on a semiconductor substrate and having a gate electrode connected to a word line, a drain and a source, the source being connected to a bit line,
   a charge storage electrode connected to the drain of the first transistor and formed over the gate electrode of the first transistor, being separated from the gate electrode by an insulating film to form a capacitor,
   a semiconductor layer formed over the charge storage electrode, being separated from the charge storage electrode by an insulating film,
   a second MOS transistor (Q2) of a second channel type different from the first channel type, formed in the semiconductor layer and having a source and a drain, the charge storage electrode forming a gate electrode of the second MOS transistor,
   the drain of the second transistor being connected to a power supply,
   the source of the second transistor being connected to a bit line, which is either the same as or separate from the first-mentioned bit line,
   said memory device further comprising means for controlling writing and reading of data in and out of the memory cell,
   said control means writing data by controlling the potential on the word line and the bit line connected to the first MOS transistor to supply an electric charge corresponding to the data on the bit line connected to the first MOS transistor,
   said control means reading data by controlling the potential on the word line to cause conduction or nonconduction of the second MOS transistor depending on the electric charge stored on the charge storage electrode, thereby providing an output on the bit line connected to the second MOS transistor, the output differing depending on the conduction or nonconduction of the second MOS transistor.

2. A device according to claim 1, wherein the semiconductor is silicon.

3. A device according to claim 2, wherein the semiconductor layer is a polysilicon layer.

4. A device according to claim 1, wherein a diode is formed between the sources of the first and the second MOS transistors.

5. A device according to claim 1, wherein the source of the first MOS transistor is connected to a bit line for writing, and the source of the second MOS transistor is connected to a bit line for reading, said bit line for reading being separate from the bit line for writing.

6. A device according to claim 5, wherein a pn junction diode or a Schottky diode is formed between the drain of the second MOS transistor and the charge storage electrode.

7. A device according to claim 6, wherein the charge storage electrode is of the conductivity type different from the conductivity type of the drain of the first MOS transitor, to form a pn juntion diode between them.

8. A device according to claim 6, wherein the charge storage electrode is of a metal to form a Schottky junction diode between it and the drain of the first MOS transistor.

9. A semiconductor memory device comprising a memory cell, which comprises
   a first MOS transistor (Q1) of a first channel type formed on a semiconductor substrate and having a gate electrode connected to a word line, a drain and a source, the source being connected to a bit line,
   a charge storage electrode connected to the drain of the first transistor and formed over the gate electrode of the first transistor, being separated from the gate electrode by an insulating film to form a capacitor, a semiconductor layer formed over the charge storage electrode, being separated from the charge storage electrode by an insulating film, a second MOS transistor (Q2) of a second channel type different from the first channel type, formed in the semiconductor layer and having a source and a drain, the charge storage electrode forming a gate electrode of the second MOS transistor, the drain of the second transistor being connected to a power supply, the source of the second transistor being connected to a bit line, which is either the same as or separate from the first-mentioned bit line, said memory device further comprising means for controlling writing and reading of data in and out of the memory cell, said control means applying a first potential to the word line to make conductive the first MOS transistor for writing data, applying a first potential to the source of the first MOS transistor, for writing data "1", and applying a second potential to the source of the first MOS transistor for writing data "0", said control means applying a second potential to the word line to keep the first transistor nonconductive for maintaining the data stored on the charge storage electrode, said control means applying a third potential to the word line for reading data, to change the potential on the charge storage electrode to make the second MOS transistor conductive or nonconductive depending on the data stored on the charge storage electrode, thereby transmitting or not transmitting the potential from the power supply to the source of the second MOS transistor and hence to the bit line connected thereto, the transmission and nontransmission of the potential from the power supply providing different potentials on the bit line connected to the source of the second transistor.

10. A device according to claim 9, wherein the semiconductor is silicon.

11. A device according to claim 10, wherein the first MOS transistor is an n-channel transistor, and the second MOS transistor is a p-channel transistor, and the third potential as applied to the word line is lower than the second potential as applied to the word line, which in turn is lower than the first potential as applied to the word line, and the second potential as applied to the source of the first MOS transistor is lower than the first potential as applied to the source of the second MOS transistor.

12. A device according to claim 10, wherein the semiconductor layer is a polysilicon layer.

13. A device according to claim 9, wherein a diode is formed between the sources of the first and the second MOS transistors.

14. A device according to claim 13, wherein the source of the first MOS transistor and the source of the second MOS transistor are in contact with each other to form a pn junction diode, and the source of the second transistor is connected to the common bit line used both for writing and reading.

15. A device according to claim 13, wherein the source of the first MOS transistor and the source of the second MOS transistor are in contact with each other through a metal layer to form a pn Schottky junction diode between the metal layer and the one of the sources, and the source of the second transistor is connected to a common bit line used both for writing and reading.

16. A device according to claim 9, wherein the source of the first MOS transistor is connected to a bit line for writing, and the source of the second MOS transistor is connected to a bit line for reading, said bit line for reading being separate from the bit line for writing.

17. A device according to claim 16, wherein a pn junction diode or a Schottky diode is formed between the drain of the second MOS transistor and the charge storage electrode.

18. A device according to claim 17, wherein the charge storage electrode is of the conductivity type different from the conductivity type of the drain of the first MOS transistor, to form a pn junction diode between them.

19. A device according to claim 17, wherein the charge storage electrode is of a metal to form a Schottky junction diode between it and the drain of the first MOS transistor.

20. A device according to claim 9, wherein the channels of the first and the second transistors extend in a direction of the bit lines and the word lines extend in a direction orthogonal to the direction of the bit lines.

* * * * *